US011393624B2

(12) United States Patent
Song et al.

(10) Patent No.: US 11,393,624 B2
(45) Date of Patent: Jul. 19, 2022

(54) ELECTRONIC COMPONENT AND BOARD HAVING THE SAME MOUNTED THEREON

(71) Applicant: SAMSUNG ELECTRO-MECHANICS CO., LTD., Suwon-si (KR)

(72) Inventors: Gyeong Ju Song, Suwon-si (KR); Beom Joon Cho, Suwon-si (KR); Sang Yeop Kim, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 17/306,105

(22) Filed: May 3, 2021

(65) Prior Publication Data

US 2022/0093328 A1    Mar. 24, 2022

(30) Foreign Application Priority Data

Sep. 21, 2020  (KR) .................. 10-2020-0121564

(51) Int. Cl.
| | |
|---|---|
| *H01G 4/30* | (2006.01) |
| *H01G 2/06* | (2006.01) |
| *H05K 1/18* | (2006.01) |
| *H05K 1/11* | (2006.01) |

(52) U.S. Cl.
CPC .............. *H01G 2/06* (2013.01); *H01G 4/30* (2013.01); *H05K 1/111* (2013.01); *H05K 1/181* (2013.01); *H05K 2201/10015* (2013.01)

(58) Field of Classification Search
CPC ....................................................... H01G 2/06
USPC ....................................................... 174/260
See application file for complete search history.

(56) References Cited

U.S. PATENT DOCUMENTS

| | | | |
|---|---|---|---|
| 2012/0236463 A1 | 9/2012 | Haruki et al. | |
| 2016/0260546 A1* | 9/2016 | Mori | H01G 4/12 |
| 2018/0374639 A1* | 12/2018 | Akiyoshi | H01G 4/232 |
| 2018/0374640 A1 | 12/2018 | Akiyoshi | |
| 2021/0013131 A1* | 1/2021 | Chu | H05K 1/118 |

FOREIGN PATENT DOCUMENTS

| | | |
|---|---|---|
| JP | 2012-212861 A | 11/2012 |
| JP | 2019-009359 A | 1/2019 |
| JP | 2019-009360 A | 1/2019 |

* cited by examiner

*Primary Examiner* — Stanley Tso
(74) *Attorney, Agent, or Firm* — Morgan, Lewis & Bockius LLP

(57) ABSTRACT

A board having an electronic component mounted thereon includes a capacitor body; a pair of external electrodes disposed on both ends of the capacitor body, respectively; a pair of metal frames including a pair of connection portions connected to the pair of external electrodes, respectively, and a pair of mounting portions each having a protrusion on a lower side thereof, respectively; a board; and a pair of electrode pads disposed on an upper surface of the board and connected to the pair of metal frames, respectively, and each having a groove portion corresponding to the protrusion on an upper surface thereof.

19 Claims, 6 Drawing Sheets

I-I'

ELECTRONIC COMPONENT AND BOARD HAVING THE SAME MOUNTED THEREON

CROSS-REFERENCE TO RELATED APPLICATION(S)

This application claims benefit of priority to Korean Patent Application No. 10-2020-0121564 filed on Sep. 21, 2020 in the Korean Intellectual Property Office, the disclosure of which is incorporated herein by reference in its entirety.

TECHNICAL FIELD

The present disclosure relates to a board having an electronic component mounted thereon.

BACKGROUND

A multilayer capacitor has been used in various electronic devices as a multilayer capacitor may be reduced in size and implemented with high capacity.

Recently, as eco-friendly vehicles and electric vehicles have been rapidly developed, the importance of a power driving system in a vehicle has increased, and demand for a multilayer capacitor required for the power driving system has also increased.

To use a multilayer capacitor as a component for a vehicle, a high level of thermal reliability, electrical reliability, and mechanical reliability may be necessary.

In particular, as the mounting density of components in a vehicle has increased, a multilayer capacitor which may be easily installed in a limited space, implemented with high capacity, and having excellent durability against vibrations and deformation has been necessary.

Also, as a method for improving durability of a multilayer capacitor against vibrations and deformation, a method of mounting a multilayer capacitor to be spaced apart from a board using a metal frame may be used.

However, in the case of an electronic component using such a metal frame, since a surface of the metal frame is smooth, the metal frame may easily deteriorate along with an electrode pad of the board when the component is mounted on a board.

SUMMARY

An aspect of the present disclosure is to provide a board having an electronic component mounted thereon which may improve durability of a multilayer capacitor against vibrations and deformation, and may improve bonding strength between a metal frame and a board of the electronic component.

According to an aspect of the present disclosure, a board having an electronic component mounted thereon includes a capacitor body; a pair of external electrodes disposed on both ends of the capacitor body, respectively; a pair of metal frames including a pair of connection portions connected to the pair of external electrodes, respectively, and a pair of mounting portions each having a protrusion on a lower side thereof, respectively; a board; and a pair of electrode pads disposed on an upper surface of the board and connected to the pair of metal frames, respectively, and each having a groove portion corresponding to the protrusion on an upper surface thereof.

A height of the protrusion may be defined as g, a diameter of the protrusion may be defined as c, and g and c may satisfy $1/6 \leq g/c$ A width of the mounting portion may be defined as a, a diameter of the protrusion may be defined as c, and a and c may satisfy $1/6 \leq c/a$.

A width of the electrode pad may be defined as e, a diameter of the groove portion may be defined as d, and e and d may satisfy $1/6 \leq d/e$.

A depth of the groove portion may be defined as h, a diameter of the groove portion may be defined as d, and h and d may satisfy $1/6 \leq h/d$.

According to another aspect of the present disclosure, a board having an electronic component mounted thereon includes a capacitor body; a pair of external electrodes disposed on both ends of the capacitor body, respectively; a pair of metal frames including a pair of connection portions connected to the pair of external electrodes, respectively, and a pair of mounting portions each having a groove portion on a lower side thereof, respectively; a board; and a pair of electrode pads disposed on an upper surface of the board and connected to the pair of metal frames, respectively, and each having a protrusion on an upper side thereof to correspond to the groove portion.

The capacitor body may include a dielectric layer and a plurality of internal electrodes alternately disposed with the dielectric layer interposed therebetween.

The external electrode may include a head portion disposed on one surface of the capacitor body; and a band portion extending from the head portion to portions of upper and lower surfaces and both side surfaces of the capacitor body.

In the metal frame, the connection portion may be connected to the head portion, and the mounting portion may be bent on a lower end of the connection portion and extend therefrom.

The protrusion may be disposed in the groove portion.

According to another aspect of the present disclosure, an electronic component may include: a capacitor body; first and second external electrodes disposed on both ends of the capacitor body, respectively; and first and second metal frames including first and second connection portions connected to the first and second external electrodes, respectively, and first and second mounting portions each having a groove portion or a protrusion on a lower side thereof, respectively. The first and second mounting portions may be bent on lower ends of the first and second connection portion, respectively, and may extend from the first and second lower ends of the first and second connection portion, respectively, toward each other.

The groove portion or the protrusion may be disposed only on the lower side of the mounting portion.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
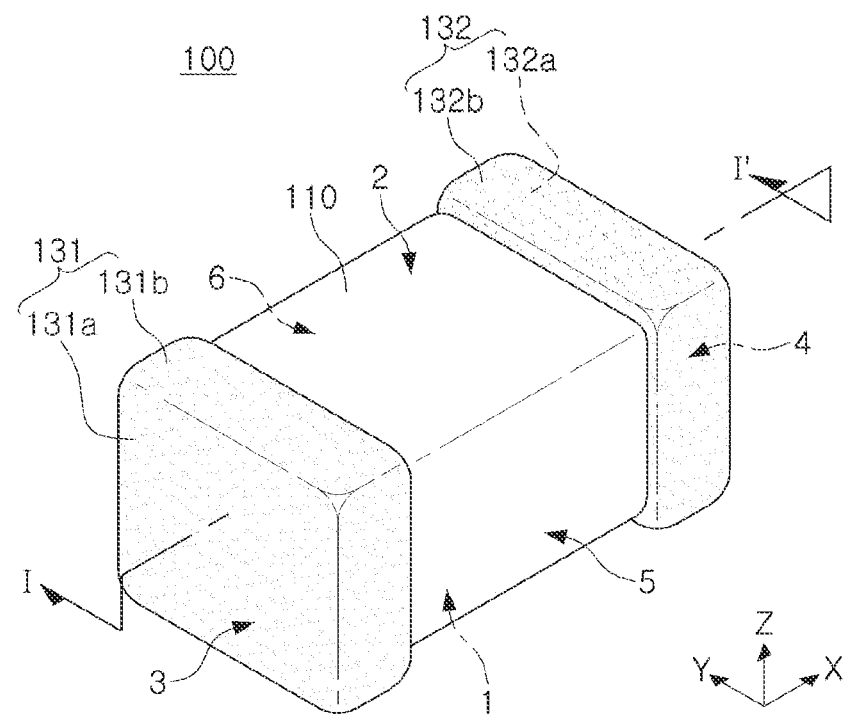
FIG. 1 is a perspective diagram illustrating a multilayer capacitor according to an example embodiment of the present disclosure.

Hereinafter, embodiments of the present disclosure will be described as follows with reference to the attached drawings.

The present disclosure may, however, be exemplified in many different forms and should not be construed as being limited to the specific embodiments set forth herein.

Rather, these embodiments are provided so that this disclosure will be thorough and complete, and will fully convey the scope of the disclosure to those skilled in the art.

Accordingly, shapes and sizes of elements in the drawings may be exaggerated for clarity of description, and elements indicated by the same reference numeral are same elements in the drawings.

Further, throughout the specification, it will be understood that when a portion "includes" an element, it may further include another element, not excluding another element, unless otherwise indicated.

As for the directions of the hexahedron, in the drawings, X, Y, and Z indicated on the drawings represent a length direction, a width direction, and a thickness direction of the capacitor body, respectively.

The Z direction may be the same as a laminating direction in dielectric layers are laminated.

Figure 2:
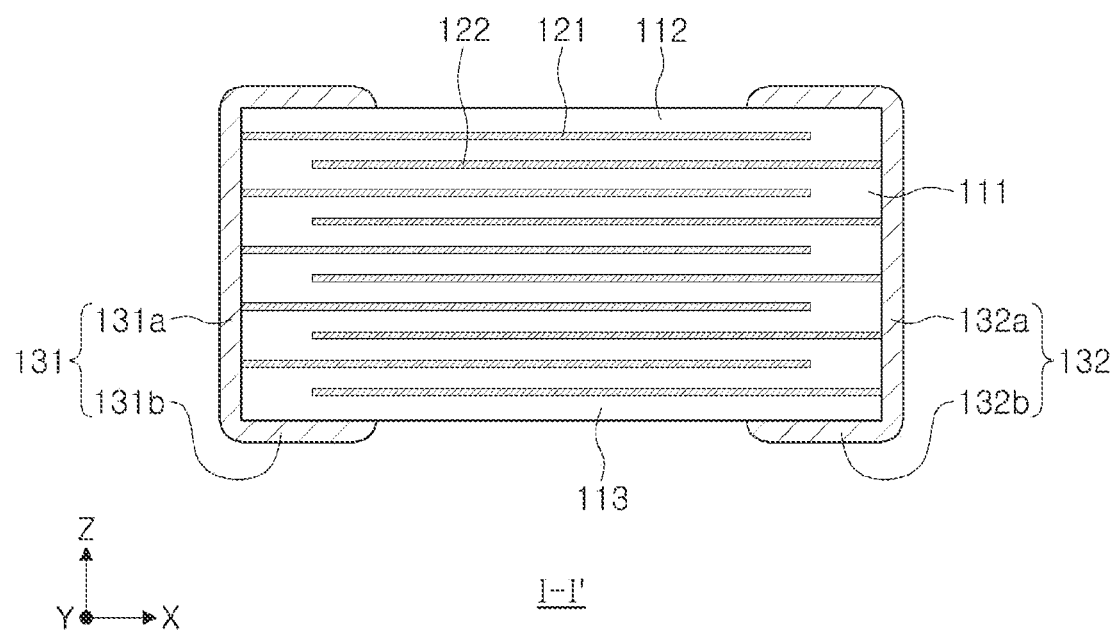
FIG. 2 is a cross-sectional diagram taken along line I-I' in FIG. 1.

FIG. 1 is a perspective diagram illustrating a multilayer capacitor according to an example embodiment. FIG. 2 is a cross-sectional diagram taken along line I-I' in FIG. 1.

A structure of a multilayer capacitor 100 applied to the electronic component of the example embodiment will be described with reference to FIGS. 1 and 2.

The multilayer capacitor 100 in the example embodiment may include a capacitor body 110 and first and second external electrodes 131 and 132 disposed on both ends of the capacitor body 110 in the X direction, respectively.

The capacitor body 110 may be obtained by laminating a plurality of dielectric layers 111 in the Z direction and sintering the dielectric layers, and boundaries between the dielectric layers 111 of the capacitor body 110 adjacent to each other may be integrated such that it may be difficult to identify the boundaries without using a scanning electron microscope (SEM).

The capacitor body 110 may include a plurality of dielectric layers 111 and first and second internal electrodes 121 and 122 alternately disposed in the Z direction with the dielectric layers 111 interposed therebetween. In this case, the first and second internal electrodes 121 and 122 may have different polarities.

The capacitor body 110 may include an active region and cover regions 112 and 113.

The active region may contribute to the formation of capacitance of the multilayer capacitor.

The cover regions 112 and 113 may be provided in upper and lower portions of the active region in the Z direction as margin portions.

The cover regions 112 and 113 may be provided by laminating a single dielectric layer or two or more dielectric layers on the upper and lower surfaces of the active region, respectively.

The cover regions 112 and 113 may prevent damages to the first and second internal electrodes 121 and 122 caused by physical or chemical stress.

The capacitor body 110 may have a substantially hexahedral shape, but an example embodiment thereof is not limited thereto.

In the example embodiment, the capacitor body 110 may include first and second surfaces 1 and 2 opposing each other in the Z direction, third and fourth surfaces 3 and 4 and opposing each other in the X direction and connected to the first and second surfaces 1 and 2, and fifth and sixth surfaces 5 and 6 opposing each other in the Y direction and connected to the first and second surfaces 1 and 2 and the third and fourth surfaces 3 and 4. The first surface 1 may be a mounting surface.

The shape and the dimensions of the capacitor body 110 and the number of the laminated dielectric layers 111 are not limited to the examples illustrated in the drawings.

The dielectric layer 111 may include ceramic powder, $BaTiO_3$ ceramic powder, for example.

$BaTiO_3$ ceramic powder may include $(Ba_{1-x}Ca_x)TiO_3$, $Ba(Ti_{1-y}Ca_y)O_3$, $(Ba_{1-x}Ca_x)(Ti_{1-y}Zr_y)O_3$ or $Ba(Ti_{1-y}Zr_y)O_3$ in which Ca or Zr is partially solid-solute in BaTiO3, and the like, and the ceramic powder in the example embodiment is not limited thereto.

The dielectric layers 111 may further include ceramic additives, organic solvents, plasticizers, binders, and dispersants in addition to ceramic powder.

The ceramic additives may include a transition metal oxide or a transition metal carbide, a rare earth element, magnesium (Mg) or aluminum (Al).

The first and second internal electrodes 121 and 122 may be applied with different polarities.

The first and second internal electrodes 121 and 122 may be formed on the dielectric layers 111, respectively, and may be laminated in the Z direction.

The first and second internal electrodes 121 and 122 may be alternatively disposed in the capacitor body 110 in the Z direction to oppose each other with the dielectric layer 111 interposed therebetween.

In this case, the first and second internal electrodes 121 and 122 may be electrically insulated from each other by the dielectric layer 111 interposed therebetween.

In the example embodiment, the plurality of internal electrodes may be laminated in the Z direction, but an example embodiment thereof is not limited thereto, and the example embodiment may be applied to a structure in which internal electrodes are laminated in the Y direction if desired.

One end of the first internal electrode 121 may be exposed through the third surface 3 of the capacitor body 110.

The end of the first internal electrode 121 exposed through the third surface 3 of the capacitor body 110 may be electrically connected to the first external electrode 131 disposed on one end of the capacitor body 110 taken in the X direction.

One end of the second internal electrode 121 may be exposed through the fourth surface 4 of the capacitor body 110.

The end of the second internal electrode 122 exposed through the fourth surface 4 of the capacitor body 110 may be electrically connected to the second external electrode 132 disposed on one end of the capacitor body 110 taken in the X direction.

Accordingly, when a predetermined voltage is applied to the first and second external electrodes 131 and 132, electrical charges may be accumulated between the first and second internal electrodes 121 and 122.

In this case, capacitance of the multilayer capacitor 100 may be proportional to an area of overlap between the first and second internal electrodes 121 and 122 overlapping each other in the Z direction in the active region.

A material for forming the first and second internal electrodes 121 and 122 is not limited to any particular material.

For example, the first and second internal electrodes 121 and 122 may be formed using a conductive paste formed of at least one of a noble metal material, nickel (Ni), and copper (Cu).

The noble metal material may be platinum (Pt), palladium (Pd), and palladium-silver (Pd—Ag) alloy.

As a method of printing the conductive paste, a screen-printing method or a gravure printing method may be used, but an example embodiment thereof is not limited thereto.

The first and second external electrodes 131 and 132 may be provided with voltages of different polarities, may be disposed on both ends of the body 110 in the X direction, respectively, and may be electrically connected to the exposed ends of the first and second internal electrodes 121 and 122, respectively.

The first external electrode 131 may include a first head portion 131a and a first band portion 131b.

The first head portion 131a may be disposed on the third surface 3 of the capacitor body 110.

The first head portion 131a may be in contact with the end of the first internal electrode 121 exposed through the third surface 3 of the capacitor body 110 and may electrically connect the first internal electrode 121 to the first external electrode 131.

The first band portion 131b may extend from the first head portion 131a to a portion of the first, second, fifth and sixth surfaces 1, 2, 5, and 6 of the capacitor body 110.

The first band portion 131b may improve adhesion strength of the first external electrode 131.

The second external electrode 132 may include a second head portion 132a and a second band portion 132b.

The second head 132a may be disposed on the fourth surface 4 of the capacitor body 110.

The second head 132a may be in contact with the end of the second internal electrode 122 exposed through the fourth surface 4 of the capacitor body 110 and may electrically connect the second internal electrode 122 to the second internal electrode 122.

The second band portion 132b may extend from the second head portion 132a to a portion of the first, second, fifth and sixth surfaces 1, 2, 5, and 6 of the capacitor body 110.

The second band portion 132b may improve adhesion strength of the second external electrode 132.

The first and second external electrodes 131 and 132 may further include plating layers.

The plating layers may include first and second nickel (Ni) plating layers disposed on the capacitor body 110 and first and second tin (Sn) plating layers covering the first and second nickel plating layers, respectively.

Figure 3:
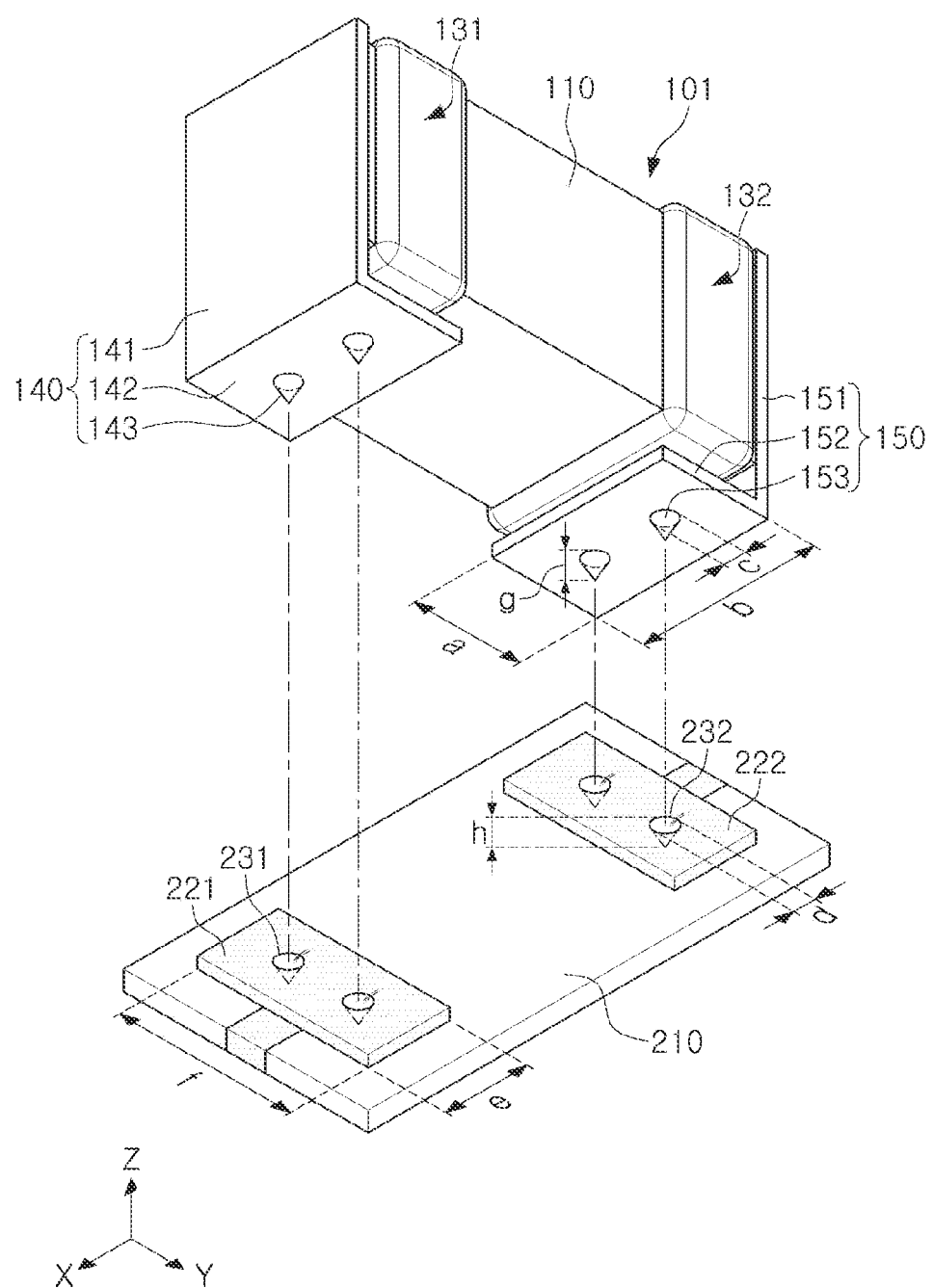
FIG. 3 is an exploded perspective diagram illustrating a bonding structure between an electronic component and a board according to an example embodiment of the present disclosure.
Figure 4:
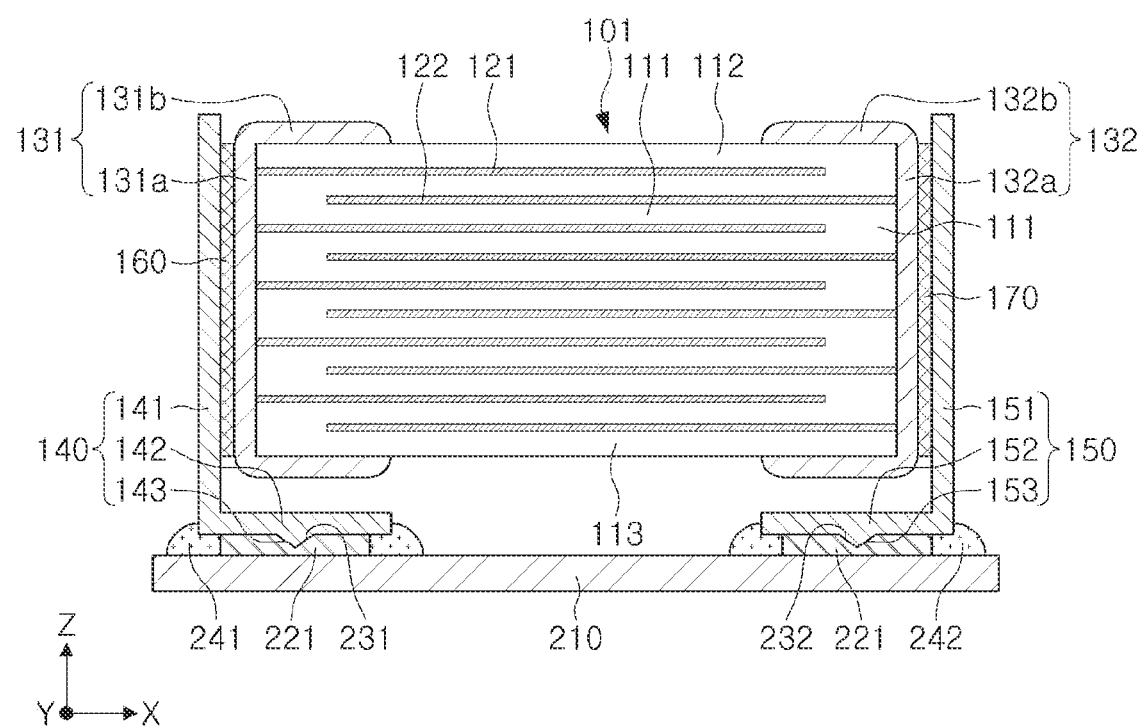
FIG. 4 is a cross-sectional diagram illustrating a state in which the electronic component and the board illustrated in FIG. 3 are combined with each other.

FIG. 3 is an exploded perspective diagram illustrating a bonding structure between an electronic component and a board according to an example embodiment. FIG. 4 is a cross-sectional diagram illustrating a state in which the electronic component and the board illustrated in FIG. 3 are combined with each other.

Referring to FIGS. 3 and 4, the electronic component in the example embodiment may include a multilayer capacitor 100 including a capacitor body 110 and first and second external electrodes 131 and 132, first and second metal frames 140 and 150 connected to the first and second external electrodes 131 and 132, respectively, a board 210, and first and second electrode pads 221 and 222.

The first metal frame 140 may include a first connection portion 141 and a first mounting portion 142.

The first connection portion 141 may be in contact with and physically connected to the first head portion 131a of the first external electrode 131, and may be electrically connected to the first head portion 131a of the first external electrode 131.

In this case, a first conductive bonding layer 160 may be disposed between the first head portion 131a of the first external electrode 131 and the first connection portion 141.

The first conductive bonding layer 160 may be formed of a high-temperature solder or a conductive bonding material, and an example embodiment thereof is not limited thereto.

The first mounting portion 142 may be bent inwardly in the X direction on a lower end of the first connection portion 141 and may extend to be formed horizontally with respect to a mounting surface.

The first mounting portion 142 may work as a connection terminal when the electronic component 101 is mounted on the board 210.

In this case, the first mounting portion 142 may be disposed to be spaced apart from the lower end of the multilayer capacitor 100.

Also, the first mounting portion 142 may include a first protrusion 143 protruding downwardly in the Z direction on a lower surface thereof.

In this case, two first protrusions 143 may be disposed side by side with each other in the Y direction as illustrated in FIG. 3, but an example embodiment thereof is not limited thereto. For example, only a single first protrusion may be disposed on a lower surface of the first mounting portion, or three or more first protrusions may be disposed on the lower surface of the first mounting portion in various arrangements.

The first protrusion 143 may have various shapes. For example, as illustrated in FIG. 3, the first protrusion 143 may have a cone shape, and as another example, the first protrusion 143 may have a pyramid shape or a hemispherical shape.

The second metal frame 150 may include a second connection portion 151 and a second mounting portion 152.

The second connection portion 151 may be physically connected to the second head portion 132a of the second external electrode 132, and may be electrically connected to the second head portion 132a of the second external electrode 132.

In this case, a second conductive bonding layer 170 may be disposed between the second head portion 132*a* of the second external electrode 132 and the second connection portion 151.

The second conductive bonding layer 170 may be formed of high-temperature solder or a conductive bonding material, and an example embodiment thereof is not limited thereto.

The second mounting portion 152 may be bent inwardly in the X direction on a lower end of the second connection portion 151 and may extend to be formed horizontally with respect to the mounting surface.

The second mounting portion 152 may work as a connection terminal when the electronic component 101 is mounted on the board 210.

In this case, the second mounting portion 152 may be disposed to be spaced apart from the lower end of the multilayer capacitor 100.

Also, the second mounting portion 152 may include a second protrusion 153 protruding downwardly in the Z direction on a lower surface thereof.

In this case, two second protrusions 153 may be arranged side by side with each other in the Y direction as in FIG. 3, but an example embodiment thereof is not limited thereto. For example, only a single second protrusion may be disposed on the lower surface of the first mounting portion, or three or more second protrusions may be arranged on the lower surface of the second mounting portion in various arrangements.

Also, the second protrusion 153 may have various shapes. For example, as illustrated in FIG. 3, the second protrusion 153 may have a cone shape, and as another example, the second protrusion 153 may have a pyramid shape or a hemispherical shape.

First and second electrode pads 221 and 222 may be disposed on the upper surface of the board 210 such that the first and second metal frames 140 and 150 may be connected thereto, respectively.

The first and second electrode pads 221 and 222 may be disposed on the upper surface of the board 210 and may be spaced apart from each other in the X direction, and may be in contact with and electrically connected to the lower surfaces of the first and second mounting portions 142 and 152 of the first and second metal frames 140 and 150, respectively.

In this case, the first mounting portion 142 may be bonded to and physically connected to the first electrode pad 221 by a solder 231, and the second mounting portion 1562 may be bonded to and physically connected to the second electrode pad 222 by a solder 232.

The first electrode pad 221 may include a first groove portion 231 formed on the upper surface thereof and configured to be concave downwardly in the Z direction to correspond to the first protrusion 143 of the first mounting portion 142.

In this case, the first groove portion 231 may be formed in a shape substantially similar to the shape of the first protrusion 143, such that the first protrusion 143 may be inserted into and coupled to the first groove portion 231 and an upper surface of the first electrode pad 221 may be in close contact with the lower surface of the first mounting portion 142. Accordingly, the first metal frame 140 may be stably supported and installed on the board 210.

Also, the number and the size of the first groove portion 231 may be configured to be substantially the same as those of the first protrusion 143.

The positions of the first groove portion 231 and the first protrusion 143 may correspond to each other, and when a plurality of the first groove portions and a plurality of the first protrusions are provided, a distance between centers of the first groove portions may be equal to a distance between centers of the first protrusions.

The second electrode pad 222 may include a second groove portion 232 formed on an upper surface thereof and configured to be concave downwardly in the Z direction to correspond to the second protrusion portion 153.

In this case, the second groove portion 232 may have a shape substantially similar to the shape of the second protrusion 153, such that the second protrusion 153 may be inserted into and coupled to the second groove portion 232 and an upper surface of the second electrode pad 222 may be inclose contact with the lower surface of the second mounting portion 152. Accordingly, the second metal frame 150 may be stably supported and installed on the board 210.

The number and the size of the second groove portion 232 may be configured to be substantially the same as those of the first protrusion 153.

The positions of the second groove portion 232 and the second protrusion 153 may correspond to each other, and when a plurality of the second groove portions and a plurality of the second protrusions are provided, a distance between centers of the second groove portions may be equal to a distance between centers of the second protrusions.

When a height of the first or second protrusion is defined as g and a diameter of the first or second protrusion is defined as c, g and c may satisfy $\frac{1}{6} \leq g/c \leq \frac{1}{2}$.

When a width of the first or second mounting portion in the X direction is defined as a and a diameter of the first or second protrusion is defined as c, a and c may satisfy $\frac{1}{6} \leq c/a \leq \frac{1}{3}$.

When a width of the first or second electrode pad in the X direction is defined as e and a diameter of the first or second groove portion is defined as d, e and d may satisfy $\frac{1}{6} \leq d/e \leq \frac{1}{3}$.

When a depth of the first or second groove portion is defined as h and a diameter of the first or second groove portion is defined as d, h and d may satisfy $\frac{1}{6} \leq h/d \leq \frac{1}{2}$.

Figure 5:
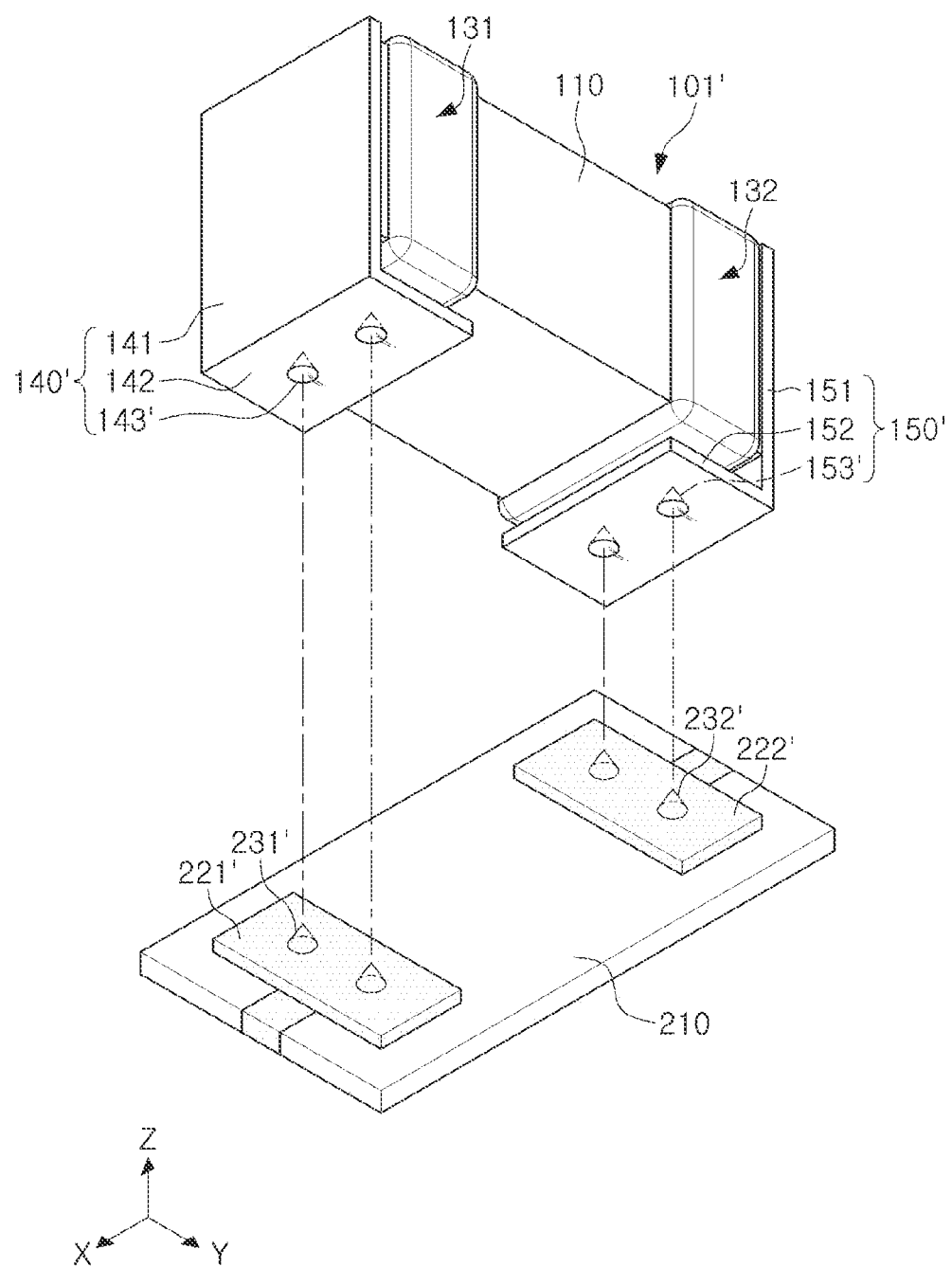
FIG. 5 is an exploded perspective diagram illustrating a bonding structure between an electronic component and a board according to another example embodiment of the present disclosure.
Figure 6:
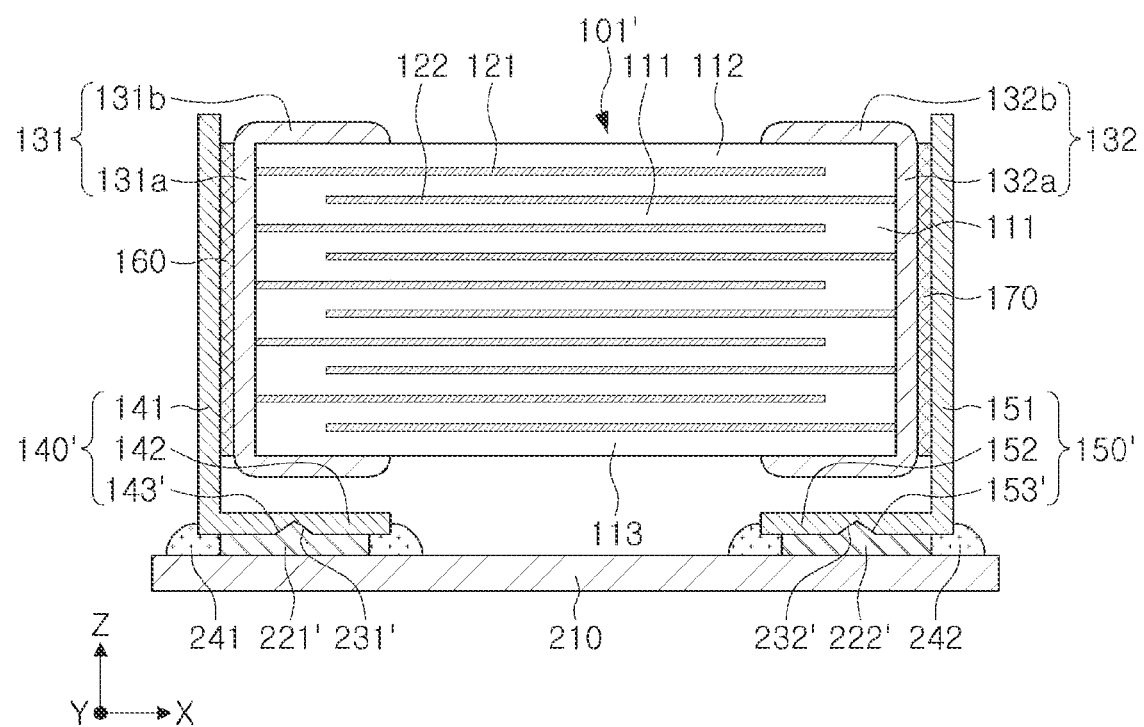
FIG. 6 is a cross-sectional diagram illustrating a state in which the electronic component and the board illustrated in FIG. 5 are combined with each other.

FIG. 5 is an exploded perspective diagram illustrating a bonding structure between an electronic component and aboard according to another example embodiment. FIG. 6 is a cross-sectional diagram illustrating a state in which the electronic component and the board illustrated in FIG. 5 are combined with each other.

In the example embodiment, the structure of the multilayer capacitor 100 of the electronic component 101', the structure in which the metal frame may include the connection portion and the mounting portion, and the structure in which the first and second electrode pads are formed on the upper surface of the board may be similar to the aforementioned example embodiments described with reference to FIGS. 3 and 4, and overlapping descriptions will not be provided. The above-described the geometric relations among the protrusion, the groove portion, the mounting portion, and the electrode pad may be applied in the example embodiment, by swapping the parameters of the mounting portion with the parameters of the electrode pad or by swapping the parameters of the groove portion with the parameters of the mounting portion.

Referring to FIGS. 5 and 6, in the electronic component 101' in the example embodiment, a first mounting portion 142 of a first metal frame 140' may include a third groove portion 143' formed on a lower surface thereof and configured to be concave upwardly.

Two third groove portions 143' may be disposed side by side with each other in the Y direction as illustrated in FIG. 5, but an example embodiment thereof is not limited thereto. For example, only a single third groove portion may be formed on a lower surface of the first mounting portion, or three or more third groove portions may be disposed on the lower surface of the first mounting portion in various arrangements to improve bonding strength between the first mounting portion and the first electrode pad.

Also, the second mounting portion 152 of the second metal frame 150' may include a fourth groove portion 153' formed in a lower surface thereof and configured to be concave upwardly in the Z direction.

In this case, two fourth groove portions 153' may be arranged side by side with each other in the Y direction as illustrated in FIG. 5, but an example embodiment thereof is not limited thereto. For example, only one fourth groove portion may be formed in the lower surface of the first mounting portion, or three or more fourth groove portions may be arranged in the lower surface of the second mounting portion in various arrangements to improve bonding force between the second mounting portion and the second electrode pad.

Also, the first electrode pad 221' may include a third protrusion 231' formed on an upper surface thereof and configured to be convex upwardly in the Z direction to correspond to the third groove portion 143' of the first mounting portion 142.

In this case, the third protrusion 231' may have a shape substantially similar to the shape of the third groove portion 143'.

Accordingly, as the third protrusion 231' is inserted into and coupled to the third groove portion 143', the upper surface of the first electrode pad 221' may be in close contact with the lower surface of the first mounting portion 143'.

Accordingly, the first metal frame 140' may be stably supported and installed on the board 210.

Also, the second electrode pad 222' may include a fourth protrusion 232' formed on an upper surface thereof and configured to be convex upwardly in the Z direction to correspond to the fourth groove portion 153' of the second mounting portion 153'.

In this case, the fourth protrusion 232' may have a shape substantially similar to the shape of the fourth groove portion 153'.

As the fourth protrusion 232' is inserted into and coupled to the fourth groove portion 153', the upper surface of the second electrode pad 222' may be in close contact with the lower surface of the second mounting portion 152.

Accordingly, the second metal frame 150' may be stably supported by and installed on the board 210.

A general multilayer capacitor may have a structure in which an external electrode of the multilayer capacitor may be in direct contact with a board by solder when being mounted the board.

Accordingly, heat or mechanical strain generated by the board may be directly transmitted to the multilayer capacitor, such that it may be difficult for the multilayer capacitor to secure a high level of reliability.

The electronic component in the example embodiment may secure a gap between the multilayer capacitor 100 and the board 210 by bonding the first and second metal frames 140 and 150 to both ends of the multilayer capacitor 100, respectively.

Accordingly, when the electronic component 101 is mounted on the board 210, stress from the board 210 may not be directly transmitted to the multilayer capacitor 100, such that thermal reliability, electrical reliability, and mechanical stability of the electronic component 101 may improve.

However, in the case of an electronic component using such a metal frame, since the surface of the metal frame is smooth, the metal frame may be easily deteriorated in a portion in contact with the electrode pad of the board when being mounted on the board.

In the example embodiments, a protrusion may be formed in the mounting portion of the metal frame, and a groove portion having a shape similar to that of the protrusion may be formed in the electrode pad of the board, or alternatively, a protrusion may be formed in the electrode pad of the board, and a groove portion having a shape similar to that of the protrusion may be formed in the mounting portion of the metal frame.

Accordingly, since the metal frame is mounted on the board in a state in which the protrusion engages with and is inserted to the groove portion, the electronic component may not be shaken in a horizontal direction of the board, the X direction or the Y direction.

Accordingly, the electronic component may have strong durability against deformation occurring in the horizontal direction of the board, and adhesion strength between the board and the electronic component mounted on the board may improve, such that the separation of the electronic component from the board after the component is mounted on the board, caused by changes in circumstance such as mechanical impacts or vibration while moving, may be prevented.

The adhesion strength of the electronic component with the board may be obtained by, after 40 electronic components were mounted on the board, applying a mechanical force to a middle portion of one side surface of the electronic component in the Z direction using an adhesion force meter, measuring each force (N) at the time point at which the metal frame of the electronic component was separated from the electrode pad of the board, and calculating an average value thereof.

Figure 7:
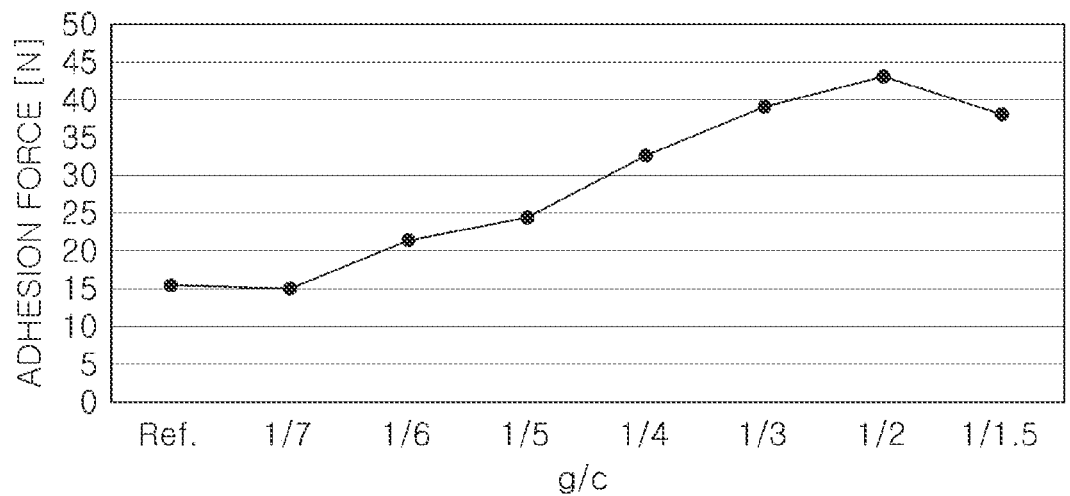
FIG. 7 is a graph illustrating adhesion strength of an electronic component according to changes in height of a protrusion of a mounting portion in correspondence with a diameter thereof.

FIG. 7 is a graph illustrating adhesion strength of an electronic component according to changes in height of a protrusion of a mounting portion in correspondence with a diameter thereof. Here, c/a was determined to be ⅓, identified as an optimal adhesion force condition in FIG. 8.

Generally required adhesion force of the electronic component with the board is 20N or greater.

Referring to FIG. 7, it is indicated that, when a diameter of the protrusion is defined as c, and a height of the protrusion is defined as g, when g/c was ⅙, the adhesion force was slightly higher than 20N, and when g/c was less than ⅙, the adhesion force was lowered below 20N. When g/c was ½, the adhesion force was the highest, and when g/c exceeded ½, the adhesion force was lowered again as compared to the maximum value.

Therefore, a preferable numerical range of g/c in which the adhesion force of the electronic component with the board may be optimized may satisfy ⅙≤g/c.

A more preferable numerical range of g/c in which the adhesion of the electronic component with the board may be optimized may satisfy ⅙≤g/c≤½.

In this case, when the depth of the groove portion is defined as h and the diameter of the groove portion is d, h may need to be the same as g of the protrusion and d may need to be the same as c of the protrusion, such that the protrusion and the groove portion may be precisely engaged with each other. Thus, h/d may satisfy ⅙≤h/d.

A more preferable numerical range of h/d may satisfy $1/6 \leq h/d \leq 1/2$.

Figure 8:
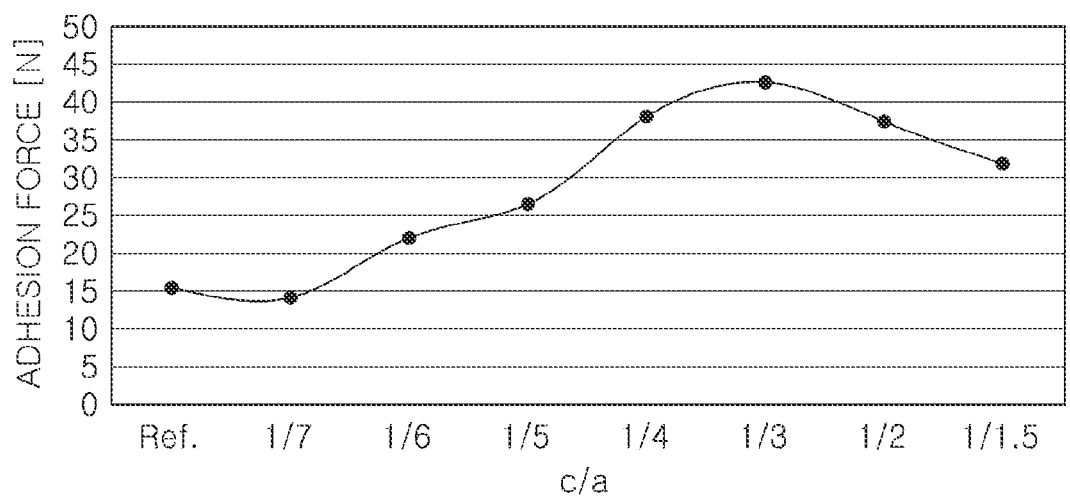
FIG. 8 is a graph illustrating adhesion strength of an electronic component according to changes in diameter of a protrusion in correspondence with a width of a mounting portion.

FIG. 8 is a graph illustrating adhesion strength of an electronic component according to changes in diameter of a protrusion in correspondence with a width of a mounting portion. Here, g/c was determined to be ½, identified as the optimum adhesion force condition in FIG. 7.

Referring to FIG. 8, it is indicated that, when the length of the mounting portion in the Y direction is defined as a and the diameter of the protrusion is defined as c, when c/a was ⅙, the adhesion force was slightly higher than 20N, and when c/a was less than ⅙, the adhesion force was lowered below 20N. When c/a was ⅓, the adhesion force was the highest, and when c/a exceeded ⅓, the adhesion force decreased again as compared to the maximum value.

Accordingly, a preferable numerical range of c/a in which the adhesion of the electronic component with the board may be optimized may satisfy $1/6 \leq c/a$.

A more preferable numerical range of c/a in which the adhesion of the electronic component with the board may be optimized may satisfy $1/6 \leq c/a \leq 1/3$.

In this case, when the length of the electrode pad in the Y direction is defined as e and the diameter of the groove portion is defined as d, e may need to be the same as a of the mounting portion and d may need to be the same as c of the protrusion, such that the protrusion and the groove portion may be precisely engaged with each other, and thus, d/e may satisfy $1/6 \leq d/e$.

A more preferable numerical range of d/e may satisfy $1/6 \leq d/e \leq 1/3$.

According to the aforementioned example embodiment, durability of the multilayer capacitor against vibrations and deformation may improve, and by improving the bonding strength between the metal frame and the board, reliability of electronic components mounted on the board may improve.

While the example embodiments have been illustrated and described above, it will be apparent to those skilled in the art that modifications and variations could be made without departing from the scope of the present invention as defined by the appended claims.

What is claimed is:

1. A board having an electronic component mounted thereon, the board comprising:
   a capacitor body;
   a pair of external electrodes disposed on both ends of the capacitor body, respectively;
   a pair of metal frames including a pair of connection portions connected to the pair of external electrodes, respectively, and a pair of mounting portions each having a protrusion on a lower side thereof, respectively;
   a board; and
   a pair of electrode pads disposed on an upper surface of the board and connected to the pair of metal frames, respectively, and each having a groove portion corresponding to the protrusion on an upper surface thereof,
   wherein a height of the protrusion is defined as g, a diameter of the protrusion is defined as c, and g and c satisfy $1/6 \leq g/c$, and
   wherein a width of the mounting portion is defined as a, and a and c satisfy $1/6 \leq c/a$.

2. The board of claim 1, wherein a width of the electrode pad is defined as e, a diameter of the groove portion is defined as d, and e and d satisfy $1/6 \leq d/e$.

3. The board of claim 1, wherein a depth of the groove portion is defined as h, a diameter of the groove portion is defined as d, and h and d satisfy $1/6 \leq h/d$.

4. The board of claim 1, wherein the capacitor body includes a dielectric layer and a plurality of internal electrodes alternately disposed with the dielectric layer interposed therebetween.

5. The board of claim 1, wherein the external electrode includes:
   a head portion disposed on one surface of the capacitor body; and
   a band portion extending from the head portion to portions of upper and lower surfaces and both side surfaces of the capacitor body.

6. The board of claim 5, wherein, in the metal frame, the connection portion is connected to the head portion, and the mounting portion is bent on a lower end of the connection portion and extends from the lower end of the connection portion.

7. The board of claim 1, wherein the protrusion is disposed in the groove portion.

8. The electronic component of claim 1, wherein the protrusion has a cone shape.

9. The electronic component of claim 1, wherein the groove portion has a cone shape.

10. A board having an electronic component mounted thereon, the board comprising:
    a capacitor body;
    a pair of external electrodes disposed on both ends of the capacitor body, respectively;
    a pair of metal frames including a pair of connection portions connected to the pair of external electrodes, respectively, and a pair of mounting portions each having a groove portion on a lower side thereof, respectively;
    a board; and
    a pair of electrode pads disposed on an upper surface of the board and connected to the pair of metal frames, respectively, and each having a protrusion on an upper side thereof to correspond to the groove portion,
    wherein a height of the protrusion is defined as g, a diameter of the protrusion is defined as c, and g and c satisfy $1/6 \leq g/c$, and
    wherein a width of the electrode pad is defined as a, and a and c satisfy $1/6 \leq c/a$.

11. The board of claim 10, wherein the capacitor body includes a dielectric layer and a plurality of internal electrodes alternately disposed with the dielectric layer interposed therebetween.

12. The board of claim 10, wherein the external electrode includes:
    a head portion disposed on one surface of the capacitor body; and
    a band portion extending from the head portion to portions of upper and lower surfaces and both side surfaces of the capacitor body.

13. The board of claim 12, wherein, in the metal frame, the connection portion is connected to the head portion, and the mounting portion is bent on a lower end of the connection portion and extend therefrom.

14. The board of claim 10, wherein the protrusion is disposed in the groove portion.

15. An electronic component comprising:
    a capacitor body;
    first and second external electrodes disposed on both ends of the capacitor body, respectively; and first and second metal frames including first and second connection portions connected to the first and second external electrodes, respectively, and first and second mounting portions each having a groove portion or a protrusion on a lower side thereof, respectively, wherein the first and second mounting portions are bent on lower ends of the first and second connection portion, respectively, and extend from the first and second lower ends of the first and second connection portion, respectively, toward each other, wherein a height of the protrusion is defined as g, a diameter of the protrusion is defined as c, and g and c satisfy $1/6 \leq g/c$, or a depth of the groove portion is defined as h, a diameter of the groove portion is defined as d, and h and d satisfy $1/6 \leq h/d$, and wherein a width of the mounting portion is defined as a, and a and c satisfy $1/6 \leq c/a$ or a and d satisfy $1/6 \leq d/a$.

16. The electronic component of claim 15, wherein the groove portion or the protrusion is disposed only on the lower side of the mounting portion.

17. The electronic component of claim 15, wherein the capacitor body includes a dielectric layer and a plurality of internal electrodes alternately disposed with the dielectric layer interposed therebetween.

18. The electronic component of claim 15, wherein the external electrode includes:
- a head portion disposed on one surface of the capacitor body; and
- a band portion extending from the head portion to portions of upper and lower surfaces and both side surfaces of the capacitor body.

19. The electronic component of claim 15, wherein the protrusion or the groove portion has a cone shape.

* * * * *